United States Patent
Wegner et al.

(10) Patent No.: US 7,307,557 B2
(45) Date of Patent: Dec. 11, 2007

(54) NOISE SHAPER FOR SHAPING A POWER SPECTRAL DENSITY OF AN ERROR SIGNAL AND METHOD THEREFORE

(75) Inventors: Carsten Wegner, Siegen (DE); Thomas Schulze, Wenden (DE)

(73) Assignee: Camco Produktions-und Vertriebs GmbH fuer Beschallungs und Beleuchtungsanlagen, Wenden-Gerlingen (DE)

( * ) Notice: Subject to any disclaimer, the term of this patent is extended or adjusted under 35 U.S.C. 154(b) by 100 days.

(21) Appl. No.: 11/258,858

(22) Filed: Oct. 27, 2005

(65) Prior Publication Data

US 2006/0152396 A1    Jul. 13, 2006

Related U.S. Application Data

(60) Provisional application No. 60/622,626, filed on Oct. 28, 2004.

(51) Int. Cl.
*H03M 7/30* (2006.01)
(52) U.S. Cl. .......................................... 341/76; 341/50
(58) Field of Classification Search ........ 341/130–170, 341/50–80
See application file for complete search history.

(56) References Cited

U.S. PATENT DOCUMENTS

| | | | | | |
|---|---|---|---|---|---|
| 5,144,308 | A | * | 9/1992 | Norsworthy | 341/143 |
| 5,598,158 | A | * | 1/1997 | Linz | 341/143 |
| 5,608,400 | A | * | 3/1997 | Pellon | 341/143 |
| 5,719,573 | A | * | 2/1998 | Leung et al. | 341/143 |
| 6,005,505 | A | * | 12/1999 | Linz | 341/143 |
| 6,414,613 | B1 | * | 7/2002 | Midya et al. | 341/143 |
| 6,744,392 | B2 | * | 6/2004 | Melanson | 341/143 |

* cited by examiner

*Primary Examiner*—Lam T. Mai
(74) *Attorney, Agent, or Firm*—Greenblum & Bernstein, P.L.C.

(57) ABSTRACT

A noise shaper for shaping a power spectral density of an input signal which consists of signal intervals, wherein each signal interval has a corresponding signal amplitude being constant for a variable interval duration time of the signal interval, said noise shaper comprising a calculation unit having at least one serial connected integrator wherein each integrator calculates an integrated signal of different order from said input signal, and a weighting unit for weighting each integrated signal with a corresponding adjustable weighting coefficient according to a noise transfer function.

18 Claims, 15 Drawing Sheets

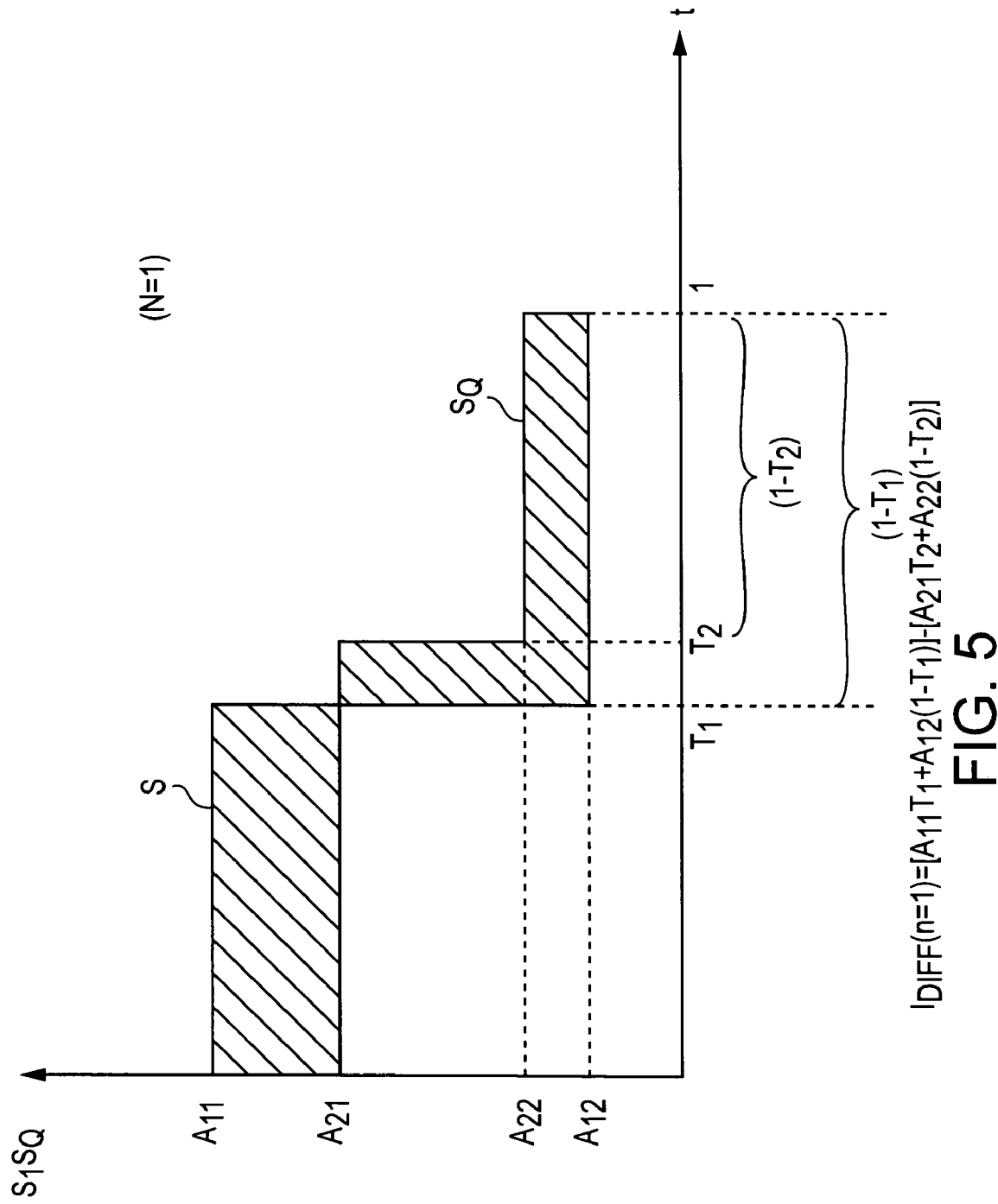

NOISE SHAPER FOR SHAPING A POWER SPECTRAL DENSITY OF AN ERROR SIGNAL AND METHOD THEREFORE

RELATED APPLICATION

This application claims the benefit of U.S. provisional application 60/622,626 filed on Oct. 28, 2004 entitled "Noise Shaping General Value and Time Discrete Signals" and which is incorporated herein by reference.

FIELD OF THE INVENTION

This invention relates generally to noise shaping of any signal which consists of signal intervals wherein each signal interval has a corresponding signal amplitude being constant for a variable interval duration time of the signal interval.

RELATED ART

Conventional audio amplifiers are analogue amplifiers usually operating in class AB mode of operation. Analogue amplifiers tend to have a low power conversion efficiency and consequently have normally a large size and high weight. Most audio sources are nowadays digital audio sources providing a digital output signal. Accordingly, it is desirable to perform the audio amplification function in the digital domain. Digital audio amplifiers using class D output stages tend to have a higher power conversion efficiency. The term class D denotes the switching mode of the power amplifier. To obtain an overall linear transfer characteristic, i.e. a wide-band audio amplifier, the power stage of class D amplifier is embedded in two parts that encode and decode the audio signal into and out of an appropriate intermediate signal, respectively, that can be amplified in a class D mode. The intermediate signal is usually a pulse width modulated signal (PWM).

FIG. 1 shows a noise shaping quantizer as an exemplary technical background to illustrate the problems underlying the present invention.

The noise shaping quantizer as shown in FIG. 1 receives an input signal from a signal source, such as an audio signal source and includes a quantizer to quantize the input signal. In digital signal processing, quantization is the process of approximating the continuous range of values or a very large set of possible discrete values with a relatively small set of discrete symbols or integer values. An input signal can be multi-dimensional and the quantization is in such a case applied to all signal dimensions. The signal source as shown in FIG. 1 is, for example, an audio signal source for outputting a sampled output signal quantized with 16 bits (two bytes) such as a wide pulse code modulated signal. For example, a compact disc audio is sampled at 44.1 kHz and quantized with 16 bits. The quantizer of the noise shaping quantizer performs quantization of the applied n bit wide PCM-signal and generates a m bit wide PCM output signal, wherein m<n, e.g. m=8 bits. Further quantization is, for instance, necessary when the digital-to-analogue converter as shown in FIG. 1 only processes a m bit wide input signal. After the digital-to-analogue conversion, the signal is normally filtered by an analogue low-pass filter LPF and output to a load or loudspeaker.

Noise shaping loops are used to improve the in band signal to noise ratio (SNR) of the quantized signal. By noise shaping, the noise produced by quantizing the input signal is forced out of the desired signal band as shown in FIG. 3. The audible frequency range is between 0 and 20 KHz. By quantization a noise ground floor NQ is generated. By means of a noise shaping loop, the constant noise floor NQ is shaped in such a manner that the noise is forced outside the audible frequency range, i.e. a frequency range higher than 20 KHz. As can be seen from FIG. 3, the signal-to-noise ratio SNR of a tone signal, e.g. with a frequency of 1 KHz is drastically increased. The higher frequency components will be filtered by the low-pass filter LPF.

Noise shaping works by feeding the quantization error back to the input. Any feedback loop function has a feedback filter. By creating a feedback loop for the quantization error itself, the quantization error can be filtered as desired. A substractor substracts the unquantized input signal from the quantized output signal output by the quantizer to generate an error signal. This error signal is supplied to a noise shaping filter. The noise shaping filter integrates the error signal to generate a feedback signal F which is substracted from the unquantized input signal to generate a difference signal which is applied to the quantizer. The noise shaper is conventionally formed by integrators which are connected in series as shown in FIG. 2. The output signal of the integrating stages are (weightedly) summed up to form the feedback signal F.

FIG. 7 shows a quantized PCM output signal as an intermediate signal for further data processing. In many applications, however, other signal forms are used as intermediate signals, such as pulse width modulated signals (PWM), multi-level pulse width modulated signals, phase shifted carrier pulse width modulated signals, or pulse amplitude modulated signals (PAM).

A two-level pulse width modulated signal is different from a pulse amplitude modulated signal (PAM) in that it provides information in time whereas a PAM-signal provides information in the amplitude. Consequently, in a two-level pulse width modulated signal information is encoded into the time position of the signal transition which lies in each switching interval.

Besides two-level pulse width modulated signals, in some applications, multi-level pulse width modulated signals are used, i.e. pulse width modulated signals having more than two amplitudes. Pulse width modulated signals are often used in power electronics since there are restricted numbers of amplitudes.

Most conventional digital audio amplifiers employ a pulse width pulse modulator. Pulse width modulation can be categorized in two major classes by the sampling method, i.e. a natural sampling PWM (NPWM) and a uniform sampling PWM (UPWM). Furthermore, it can be differentiated between single-sided and double-sided modulation. The modulation of both edges doubles the information contained in the resulting pulse train, although, the pulse train frequency is the same. PWM is used to vary the total amount power delivered to a load, such as a loudspeaker without the losses which normally occur when the power source drops its output voltage through resistive means.

FIG. 9 shows a conventional pulse width modulated signal which is, e.g. generated by comparing an analogue signal, such as a sine wave analogue signal with a triangular signal.

A phase shift carrier pulse width modulated signal, such as shown in FIG. 8 is formed by comparing an analogue input signal with several triangular carrier signals which comprise a phase shift with respect to each other. As a result from the comparison, several normal pulse width modulated signals are generated which are, when overlapped at the output, form a phase shift carrier pulse width modulated signal PSC/PWM as shown in FIG. 8. The specific example as shown in FIG. 8, is a phase shifted carrier pulse width modulated signal comprising four carriers.

Conventional noise shapers as employed in the noise shaping quantizer as shown in FIG. 1 are not able to process signals which consist of signal intervals, wherein each signal interval has a corresponding signal amplitude being constant for a variable interval duration time of such an signal interval. For instance, a pulse code modulated signal PCM, such as applied to the noise shaper as shown in FIG. 1, is a signal which consists of signal intervals wherein each signal interval has a corresponding signal amplitude which is constant for a constant (and not variable) interval duration time.

Known noise shapers are not able to generate a noise shaped feedback signal from an input signal which is two-dimensional, i.e. when the information is coded into the amplitude and into the time simultaneously.

Accordingly, it is an object of the present invention to provide a noise shaper for shaping any two-dimensional signal.

BRIEF DESCRIPTION OF THE FIGURES

The present invention is illustrated by way of example and is not limited to the accompanying figures in which like references indicate similar elements.

FIG. 5 shows a diagram for illustrating the functionality of a noise shaper according to a preferred embodiment of the present invention;

SUMMARY OF THE INVENTION

Figure 1:
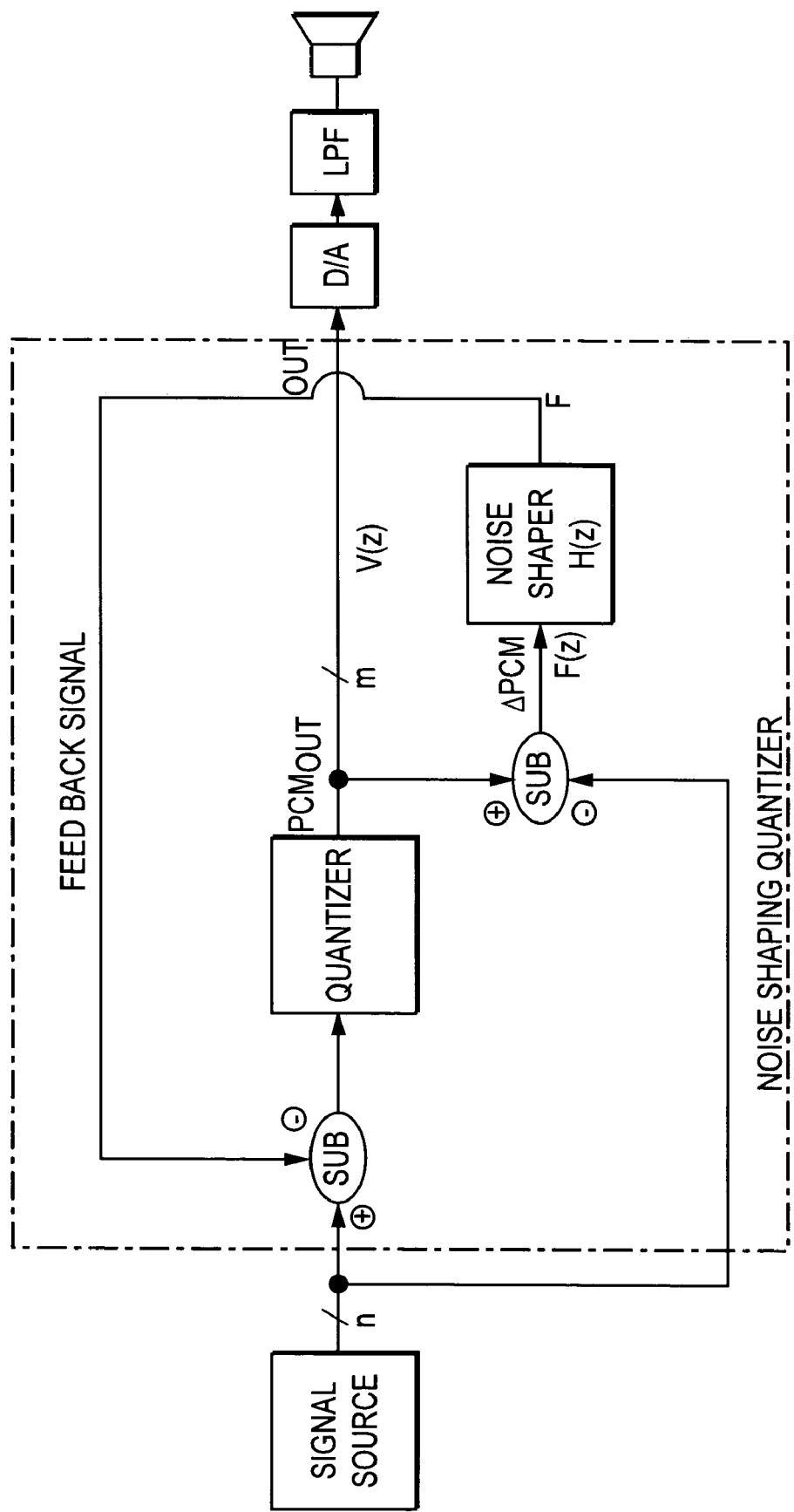
FIG. 1 shows a block diagram of a noise shaping quantizer for illustrating the problem underlying the present invention.
Figure 2:
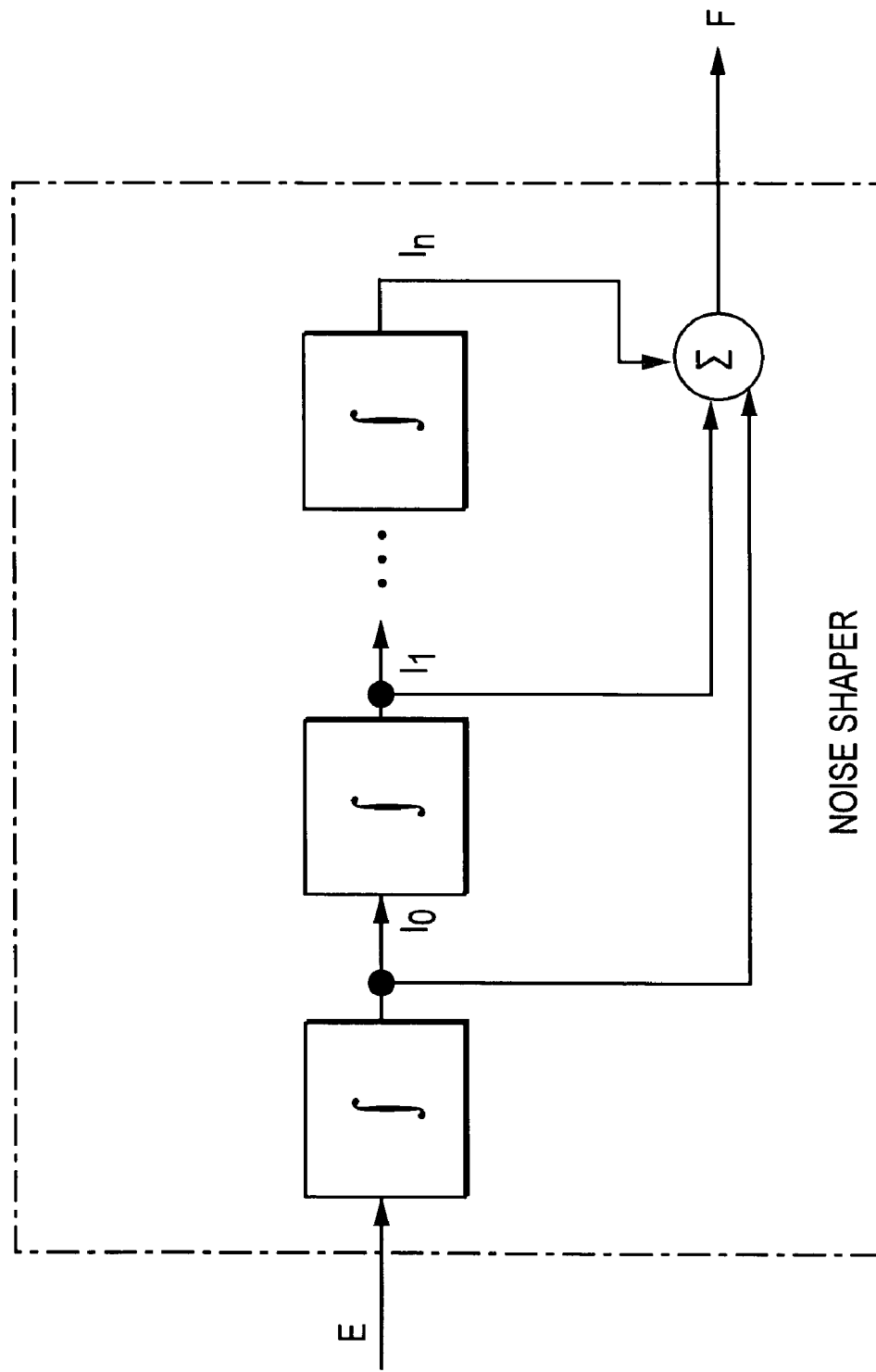
FIG. 2 shows a block diagram of a conventional noise shaper for illustrating the problem underlying the present invention.
Figure 3:
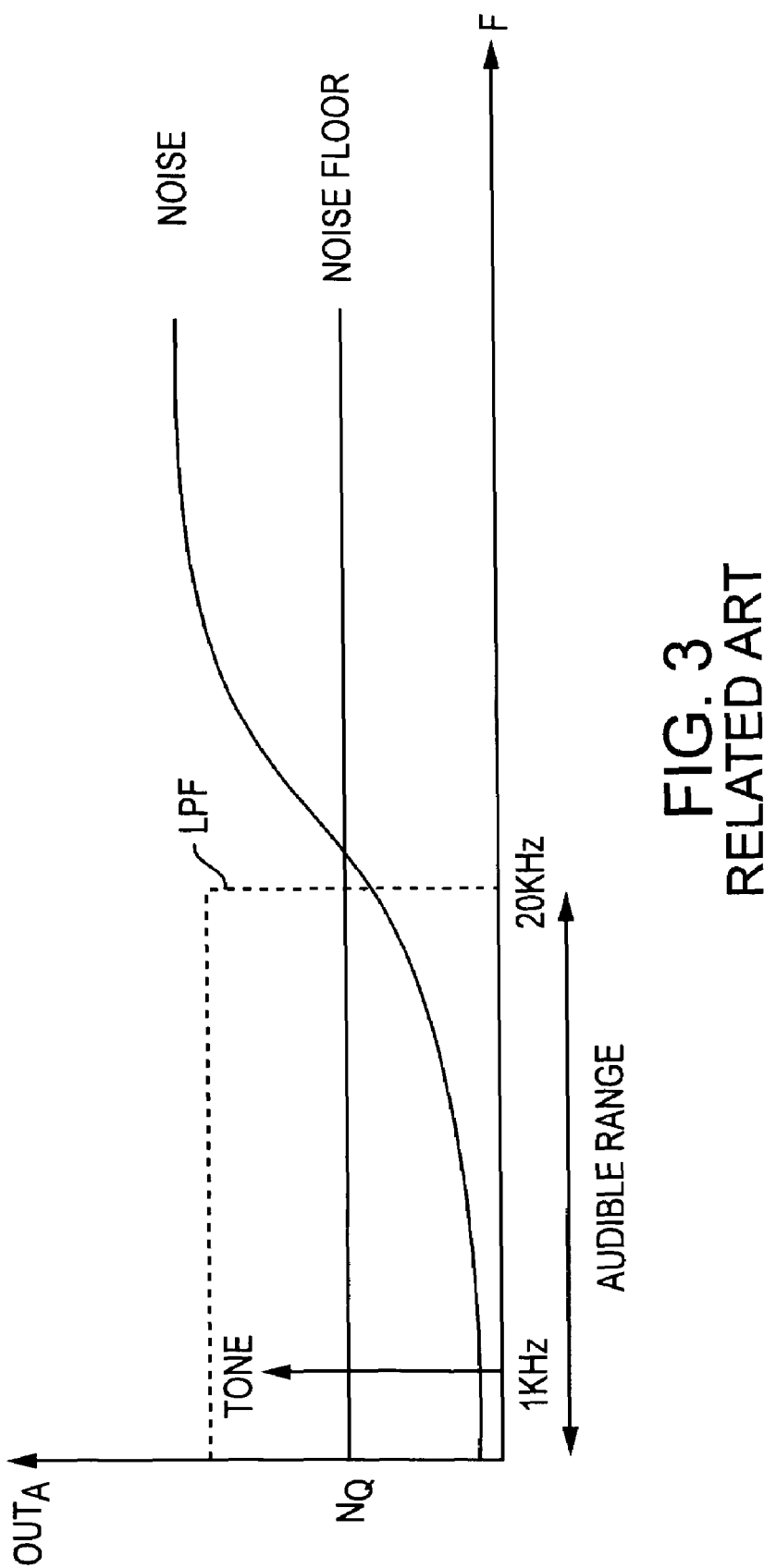
FIG. 3 shows a diagram illustrating a noise shaping as performed by a noise shaper as shown in FIG. 2.

The invention provides a noise shaper for shaping a power spectral density of an input signal which consists of signal intervals, wherein each signal interval has a corresponding signal amplitude being constant for a variable interval duration time of the signal interval, wherein said noise shaper comprises:

a calculation unit having at least one serial connected integrator wherein each integrator calculates an integrated signal of different order from said input signal; and a weighting unit for weighting each integrated signal with a corresponding adjustable weighting coefficient according to a noise transfer function.

The input signal applied to the noise shaper according to a preferred embodiment of the present invention can be a signal of any form, in particular a two-dimensional signal wherein the information is encoded, both, in the amplitude and in the time.

The invention further provides a noise shaping quantizer having a signal input for receiving an unquantized input signal;

a substractor for substracting a feedback signal from said unquantized input signal to generate a difference signal;

a first modulator for transforming the difference signal to generate a first transformed signal which consists of signal intervals, each signal interval having a corresponding signal amplitude being constant for a variable interval duration time of said signal interval;

a quantizer for quantizing said transformed first signal output by said first signal modulator to generate a quantized signal;

a second signal modulator for transforming said unquantized input signal to generate a second transformed signal which consists of signal intervals, each signal interval having a corresponding signal amplitude being constant for a variable interval duration time of said signal interval;

a noise shaper having a substracting unit for substracting said quantized signal generated by said quantizer from said transformed second signal to generate an error signal, a calculation unit having at least one serial connected integrator wherein each integrator calculates an integrated error signal of different order from said error signal, a weighting unit for weighting each integrated error signal with a corresponding adjustable weighting coefficient according to a noise transfer function and summing up the weighted integrated error signals to generate said feedback signal; and a signal output for outputting the noise shaped quantized difference signal.

The invention further provides a method for noise shaping a power spectral density of a signal which consists of signal intervals, wherein each signal interval has a corresponding signal amplitude being constant for a variable interval duration time of said signal interval, wherein said method comprises the following steps:

calculating integrated signals of different order from said input signal; and weighting each integrated signal with a corresponding adjustable weighting coefficient according to a noise transfer function and summing the weighted integrated signal to generate a noise shaped output signal.

DETAILED DESCRIPTION OF PREFERRED EMBODIMENTS

According to one aspect of the present invention, the input signal applied to the noise shaper is formed by an error signal. Said error signal is formed by substracting a quantized signal from an unquantized signal.

Figure 4:
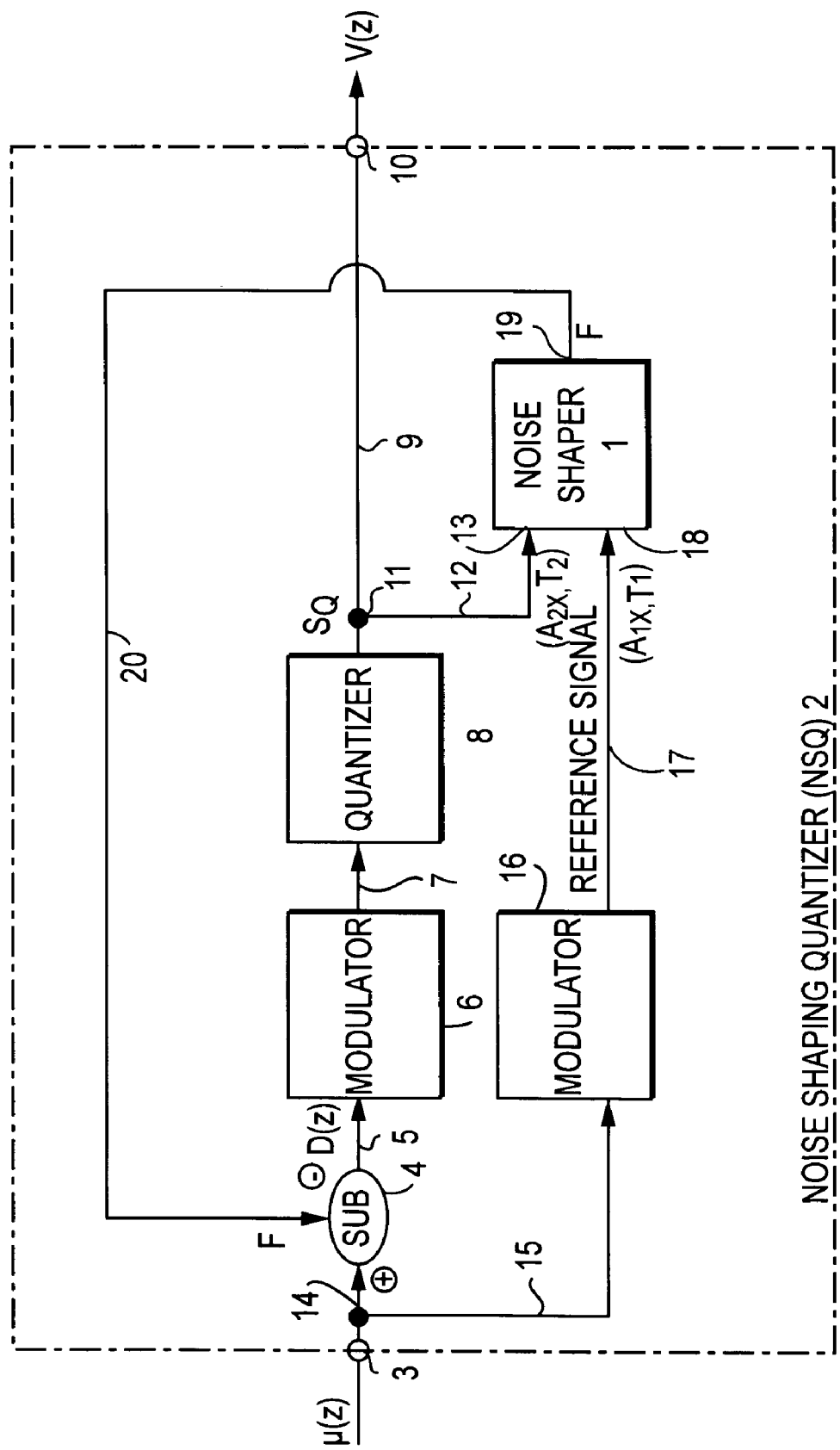
FIG. 4 shows a preferred embodiment of a noise shaping quantizer comprising a noise shaper according to a preferred embodiment of the present invention.

FIG. 4 shows a first embodiment of a noise shaping quantizer 2 comprising a noise shaper 1 according to the present invention.

The noise shaping quantizer 2 comprises a signal input 3 for receiving an unquantized input signal which is generated by any signal source, such as an audio signal. The unquantized input signal is applied to a substractor 4 within the noise shaping quantizer 2 which is provided for substracting a feedback signal F from the applied unquantized input signal to generate a difference signal D. The difference signal D is applied via a line 5 to a first modulator 6. The first modulator transforms the difference signal and generates a first transformed signal which consists of signal intervals, each signal interval having a corresponding signal amplitude being constant for a variable interval duration time of said signal interval. The modulator 6 is formed in a preferred embodiment by a pulse width modulator generating a pulse width modulated signal from the difference signal wherein said pulse width modulated signal has at least two amplitude levels. The output of the modulator 6 is connected via a line 7 to a signal input of a quantizer 8.

The quantizer quantizes the applied transformed first signal output by the first signal modulator 6 to generate a quantized signal $S_Q$ which is applied via a line 9 to an output 10 of said noise shaping quantizer 2. Furthermore, the quantized signal is branched off at a node 11 and applied via a line 12 to a first signal input 13 of the noise shaper 1 according to a preferred embodiment of the present invention.

The applied unquantized input signal is branched off at a further node 14 which is applied via a line 15 to a second signal modulator 16. The second signal modulator 16 transforms the unquantized input signal to generate a second transformed signal which consists of signal intervals wherein each signal interval has a corresponding signal amplitude which is constant for a variable interval duration time of the signal interval.

The output of the modulator 16 is connected via a line 17 to a second input 18 of a noise shaper 1 according to a preferred embodiment of the present invention.

The noise shaper 1 performs noise shaping of an error signal which is generated by substracting the quantized signal $S_Q$ output by the quantizer 8 from the transformed second signal output by the second signal modulator 16. The noise shaped error signal is output at a terminal 19 of the noise shaper 1 and fedback as a feedback signal F via a feedback line 20 to the substractor 4.

Figures 1, 6A:
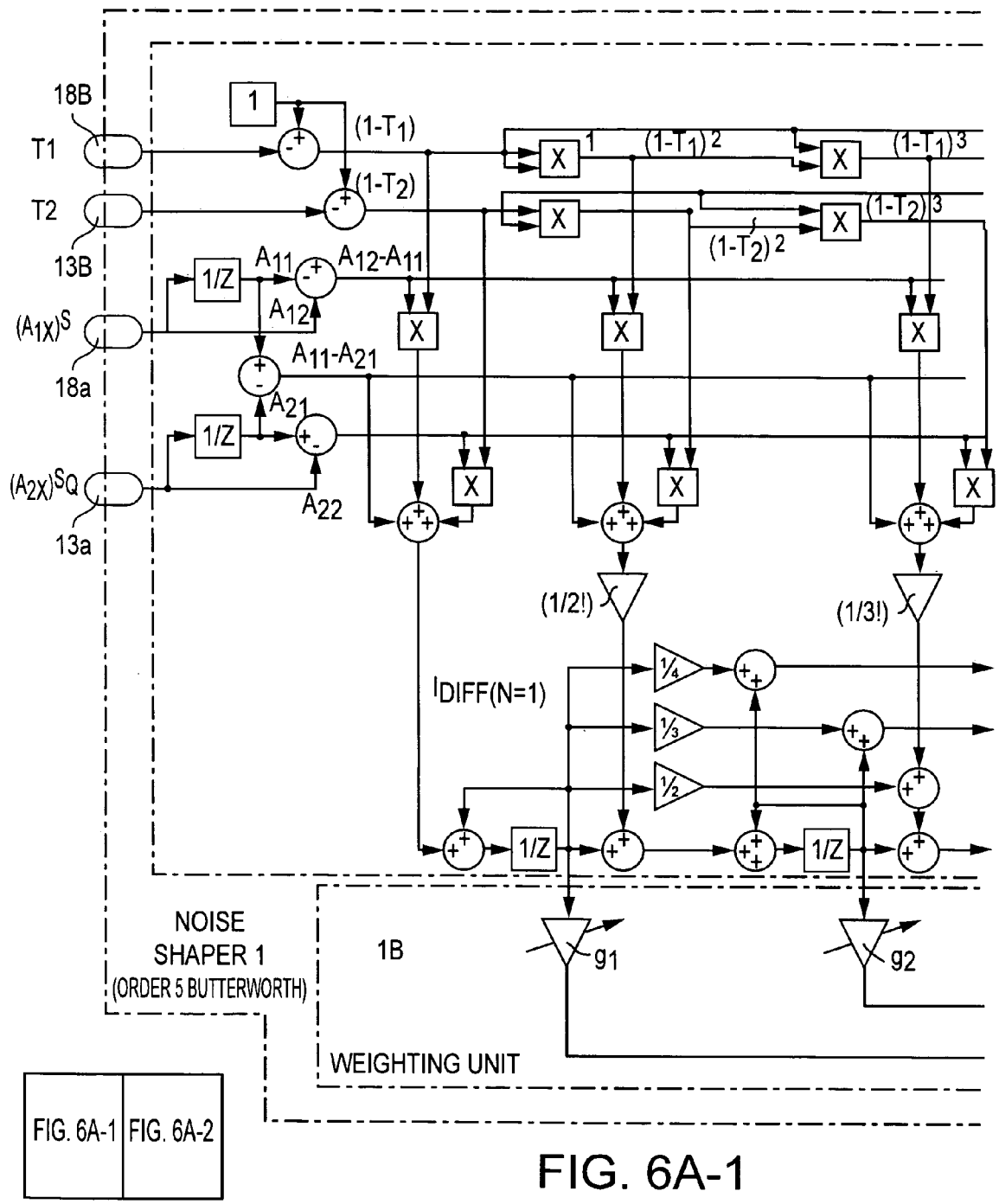
FIG. 6A shows a first preferred embodiment of a noise shaper according to the present invention.
Figures 2, 6A:
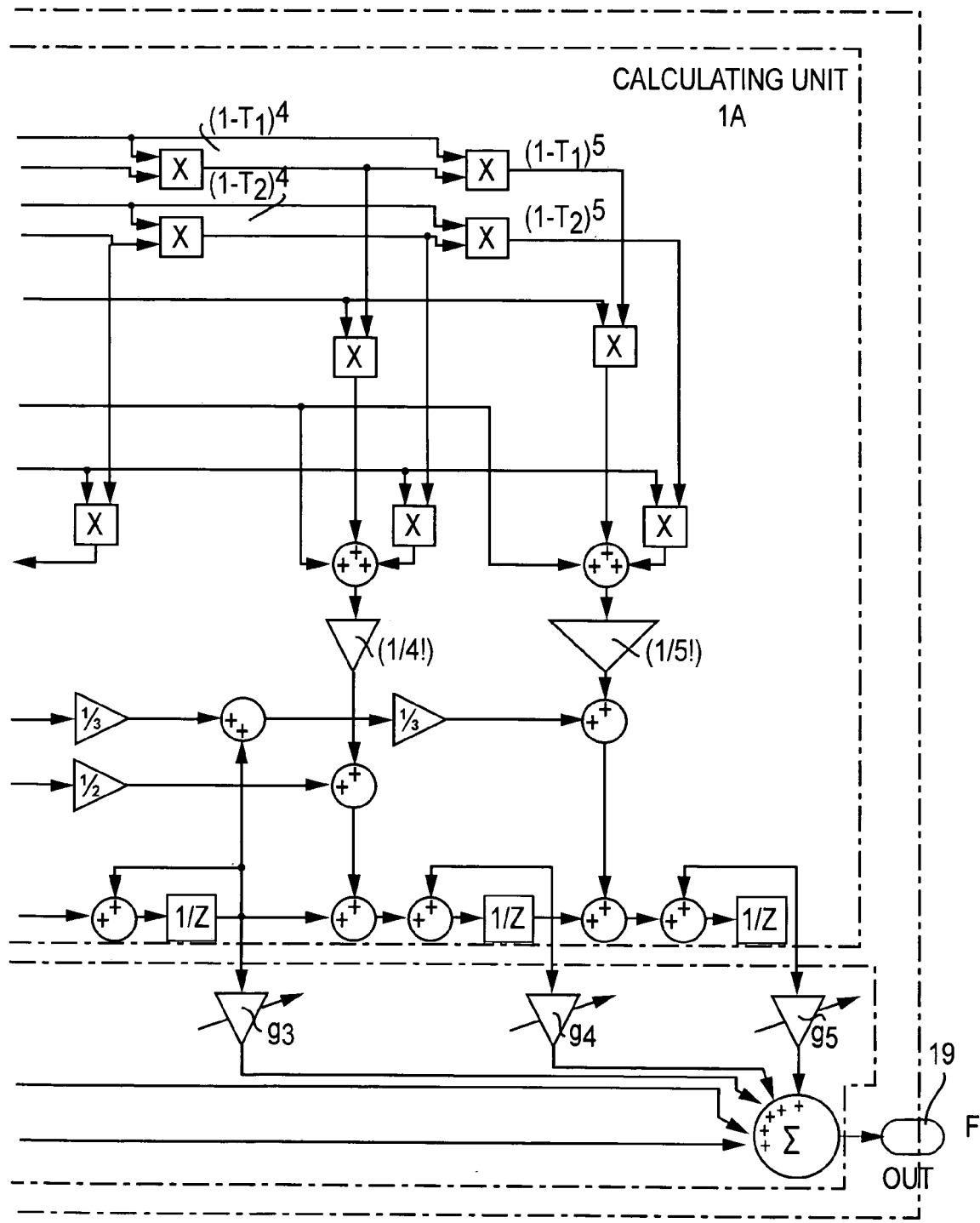

FIG. 6A shows a first preferred embodiment of the noise shaper 1 included in the noise shaping quantizer 2 of FIG. 4. The noise shaper 1 as shown in FIG. 6A can implement noise transfer functions NTFs having all zeros at a frequency of 0 i.e. a Butterworth-characteristic.

Figures 1, 6B:
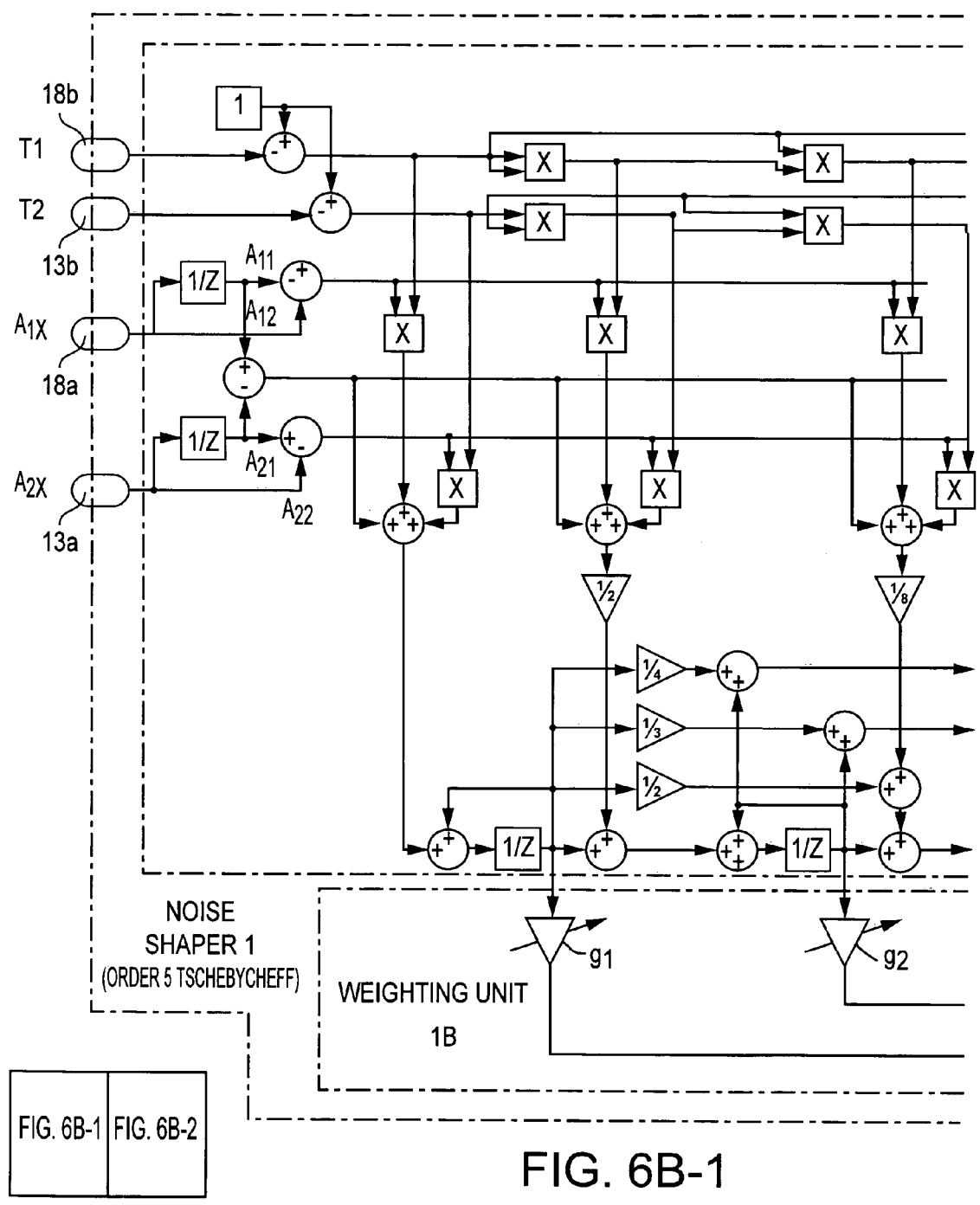
FIG. 6B shows a second preferred embodiment of a noise shaper according to the present invention.
Figures 2, 6B:
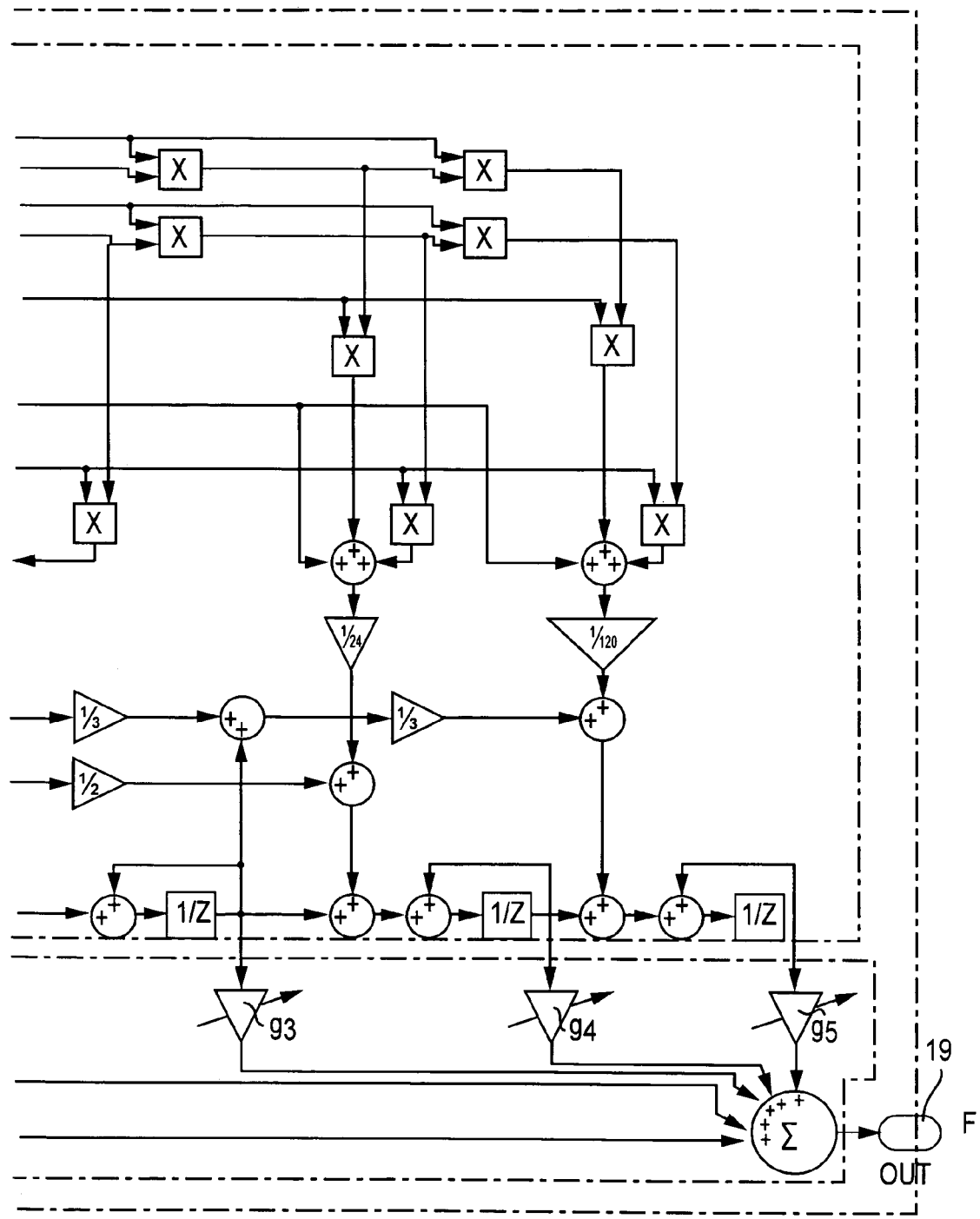
Figure 7:
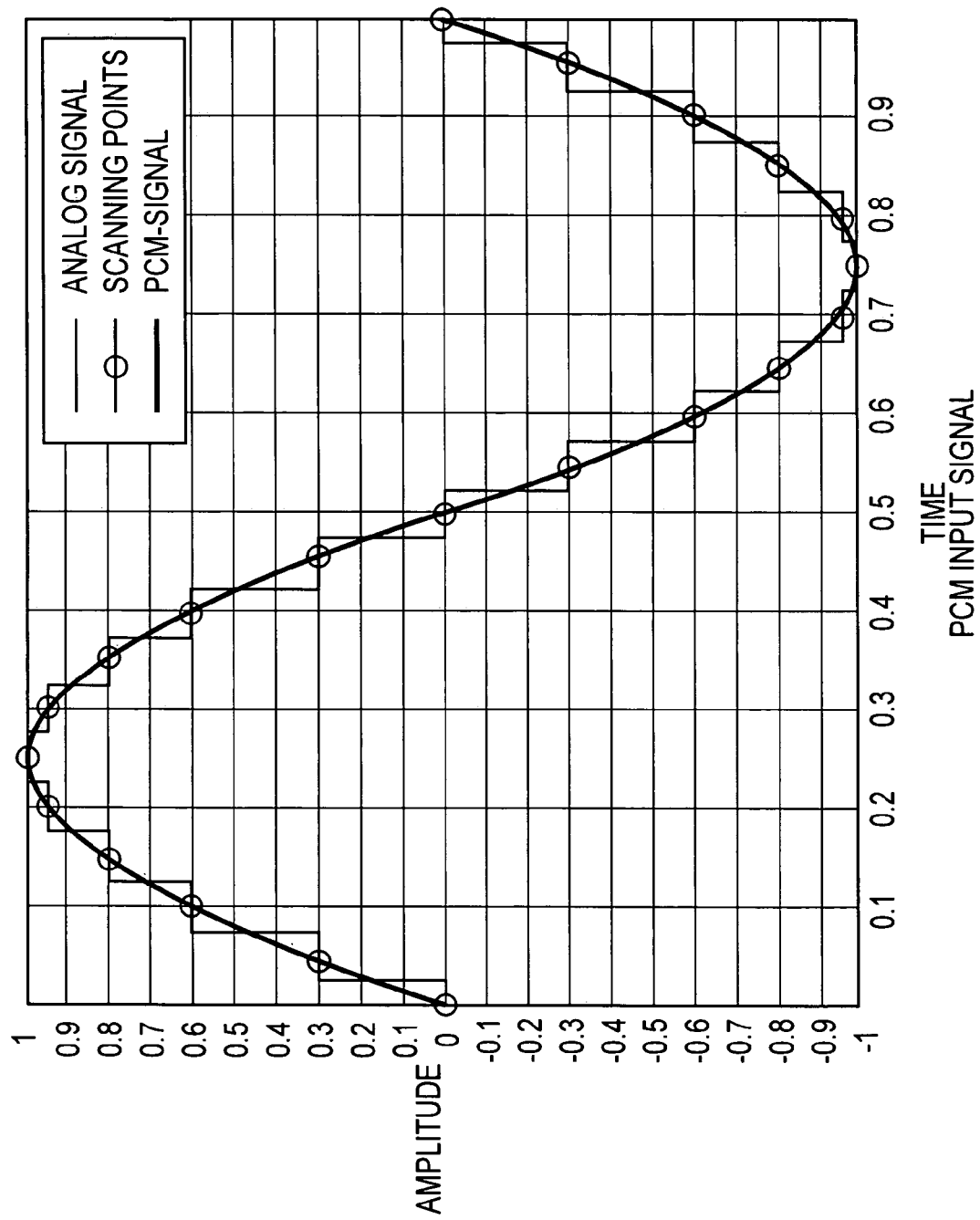
FIG. 7 shows a signal diagram to illustrate the generation of a PCM-signal.
Figure 8:
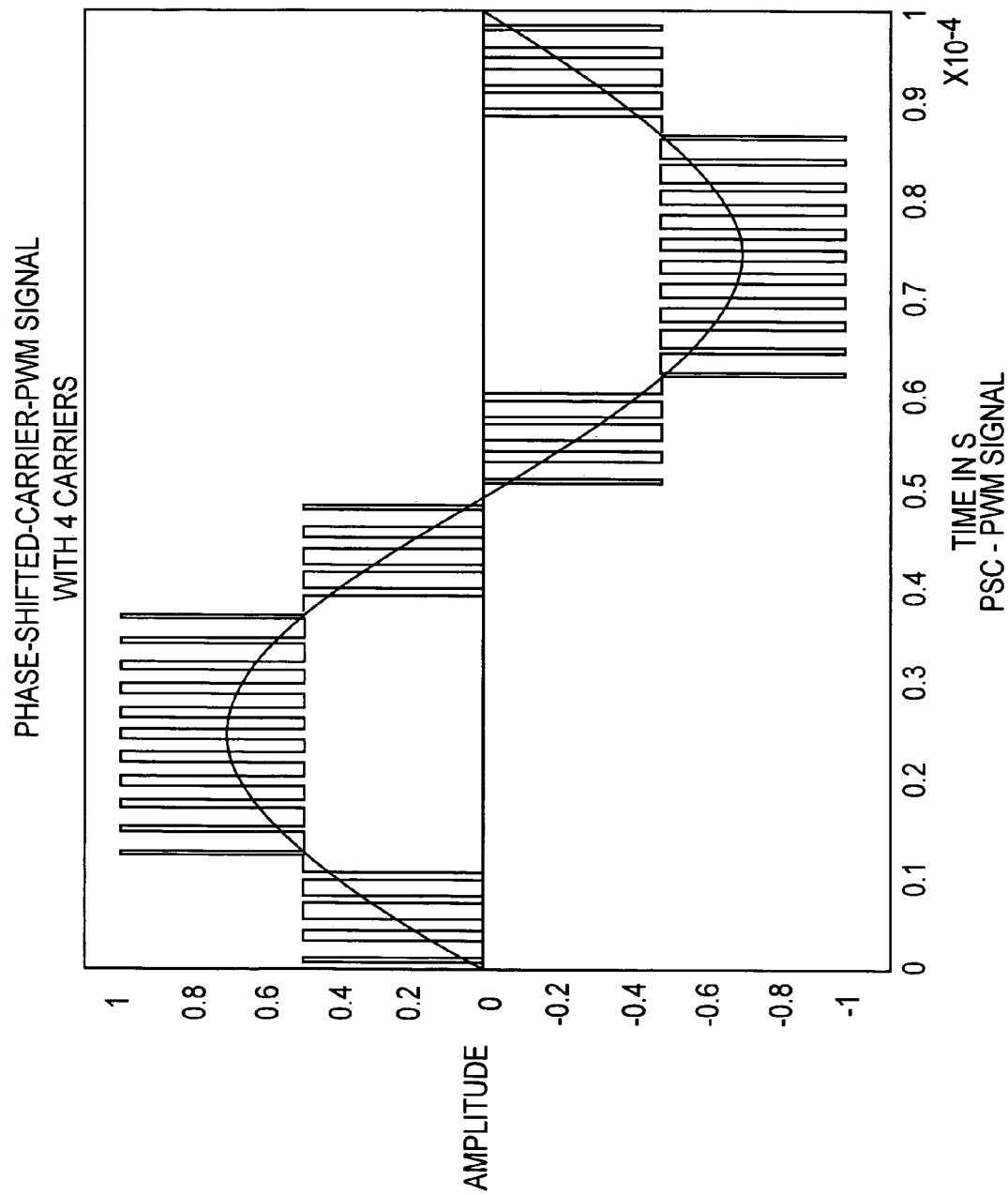
FIG. 8 shows a signal diagram of a phase shift carrier pulse width modulated signal.
Figure 9:
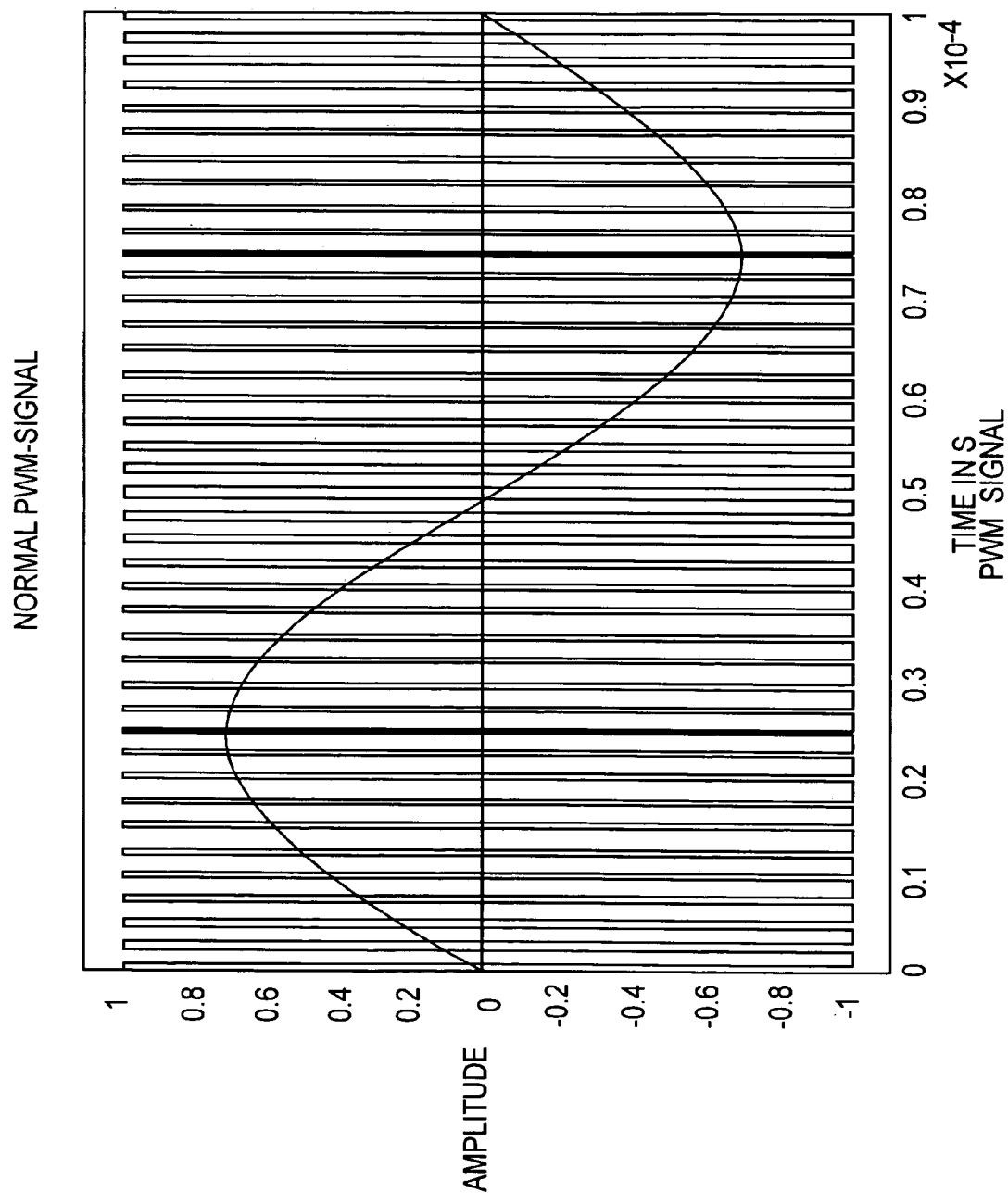
FIG. 9 shows a signal diagram of a pulse width modulated signal.

FIG. 6B shows a second preferred embodiment of the noise shaper 1 as included in the noise shaping quantizer 2 as shown in FIG. 4, wherein the noise shaper 1 according to FIG. 6B has a noise transfer function with distributed zeros to implement i.e. a Tschebycheff-characteristic.

The noise shaper 1 according to a preferred embodiment of the present invention comprises a calculating unit 1A and a weighting unit 1B. As can be seen from FIG. 6A, the calculating unit 1A comprises at least one serial connected integrator formed by a delay element (1/Z) with positive feedback, wherein each integrator calculates an integrated signal of different order. In the embodiment shown in FIG. 6A, the calculating unit 1A comprises a substracting means for substracting the quantized signal $S_Q$ output by the quantizer 8 from the unquantized signal output by the second signal modulator 16 to generate an error signal. The calculation unit 1A calculates several integrated signals of different order from the calculated error signal. In the embodiment shown in FIG. 6A, the calculating unit 1A comprises five integrators connected in series (N=5). Accordingly, the calculating unit 1A calculates different integrated signals from the error signal having an integration order of one to five, respectively.

FIG. 5 is a diagram to illustrate the functionality of a noise shaper 1 according to a preferred embodiment of the present invention. The diagram shows an unquantized signal S and a quantized signal $S_Q$, both consisting of signal intervals, wherein each signal interval has a corresponding signal amplitude being constant for a variable interval duration time of the signal interval. The unquantized signal S has a constant signal amplitude $A_{11}$ in a first signal interval ($0<t<=T_1$) and comprises a second constant signal amplitude $A_{12}$ during a second signal interval ($T_1<t<1$).

The quantized signal $S_Q$ comprises a first constant amplitude $A_{21}$ during a first signal interval ($0<t<=T_2$) and a second signal amplitude $A_{22}$ during a second signal interval ($T_2<t<1$). The diagram is normalized to a time period T of a clock signal CLK applied to the calculating unit 1A. The quantization error signal is formed by the difference between the unquantized signal S and the quantized signal $S_Q$.

The analytical integrals are given by:

First order:

$$I_1(n) = I_1(n-1) + T_1 A_{11} + (1 - T_1) A_{12}$$

Second order:

$$I_2(n) = I_2(n-1) + I_1(n-1) + \frac{1}{2}(2T_1 - T_1^2)A_{11} + \frac{1}{2}(1 - 2T_1 + T_1^2)A_{12}$$

Third order:

$$I_3(n) = I_3(n-1) + I_2(n-1) + \frac{1}{2}I_1(n-1) +$$
$$\frac{1}{6}(3T_1 - 3T_1^2 + T_1^3)A_{11} + \frac{1}{6}(1 - 3T_1 + 3T_1^2 - T_1^3)A_{12}$$

Fourth order:

$$I_4(n) = I_4(n-1) + I_3(n-1) + \frac{1}{2}I_2(n-1) + \frac{1}{6}I_1(n-1) +$$
$$\frac{1}{24}(4T_1 - 6T_1^2 + 4T_1^3 - T_1^4)A_{11} + \frac{1}{24}(1 - 4T_1 + 6T_1^2 - 4T_1^3 + T_1^4)A_{12}$$

Fifth order:

$$I_5(n) = I_5(n-1) + I_4(n-1) + \frac{1}{2}I_3(n-1) + \frac{1}{6}I_2(n-1) +$$
$$\frac{1}{24}I_1(n-1) + \frac{1}{120}(5T_1 - 10T_1^2 + 10T_1^3 - 5T_1^4 + T_1^5)A_{11} +$$
$$\frac{1}{120}(1 - 5T_1 + 10T_1^2 - 10T_1^3 + 5T_1^4 - T_1^5)A_{12}$$

For calculating the M-th integral:

M-th order:

$$I_M(n) = \sum_{k=1}^{M} \frac{I_k(n-1)}{(M-k)!} + \frac{A_{11}(1-(1-T_1)^M) + A_{12}(1-T_1)^M}{M!}$$

Accordingly, the difference integral or order M is given by:

$$I_{M_{diff}}(n) = \sum_{k=1}^{M} \frac{I_{M_{diff}}(n-1)}{(M-k)!} + \frac{\begin{array}{c}A_{11}(1-(1-T_1)^M) + A_{12}(1-T_1)^M - \\ (A_{21}(1-(1-T_2)^M) + A_{22}(1-T_2)^M)\end{array}}{M!}$$

wherein $T_1$ is the normalized time of an amplitude change from a first amplitude $A_{11}$ to a second amplitude $A_{12}$ of said unquantized signal and
wherein
$T_2$ is the normalized time of an amplitude change from a first amplitude $A_{21}$ to a second amplitude $A_{22}$ of said quantized signal within a predetermined time period T of a clock signal (CIK) within the $n^{th}$ clock frame:

$$0<T_1<1;\; 0<T_2<1;$$

The calculation of difference integrals according to the above given equation allows to noise shape any error signal which has been generated by quantizing a signal of said type. The noise shaper 1 according to the present invention comprises at least one integrator to accumulate errors. In the preferred embodiment as shown in FIG. 6A, the calculation unit 1A comprises several serial connected integrators wherein each integrator calculates an integrated signal of different order from the calculated error signal. The integrated error signal of n-th order is given by equation (7).

The weighting unit 1B weights each integrated signal output by the calculating unit 1A with a corresponding adjustable weighting coefficient $g_I$ according to a desired noise transfer function NTF.

The noise transfer function NTF depends on the adjusted weighting coefficient $g_I$.

$$NTF = f(g_1, g_2 \ldots g_N).$$

The weighting unit 1B comprises several amplifiers amplifying the applied integrated error signal from an adjustable gain $g_I$. The amplified signals are applied to an adder which sums up the weighted integrated error signals to generate the feedback signal F which is output by the noise shaper 1 via a feedback signal line 20 to a substractor 4 as shown in FIG. 4. The number of weighting coefficients depends on the topology of the circuit wherein the noise shaper 1 is implemented.

The noise shaper 1 according to the preferred embodiment as shown in FIG. 6A provides the desired characteristic with all zeros at a frequency of 0, i.e. a Butterworth-characteristic, of the noise transfer function NTF.

The noise shaper 1 according to the preferred embodiment as shown in FIG. 6B provides a different characteristic with distributed zeros, i.e. a Tschebycheff-characteristic, of the noise transfer function NTF. As can be seen in FIG. 6B, the integrators within the calculating unit 1A of the noise shaper 1 are partially feedback via amplifiers to integrators provided upstream of the integrator chain.

Figure 11:
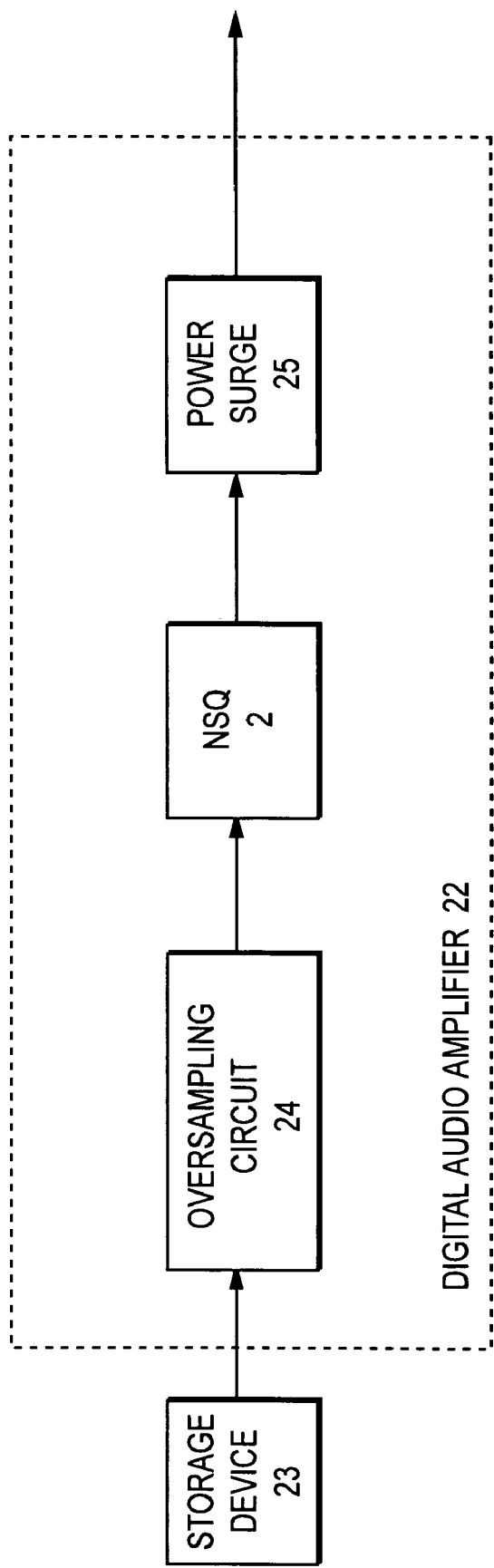
FIG. 11 shows a block diagram of a digital audio amplifier comprising a noise shaping quantizer which includes a noise shaper according to the present invention.

FIG. 11 shows a block diagram of a digital audio amplifier 22 comprising a noise shaping quantizer 2 as shown in FIG. 4 including a noise shaper 1 according to the present invention. A storage device 23, such as an audio disc applies uniformly sampled input digital data to a oversampling circuit 24 within the digital audio amplifier 22. The circuit 24 performs oversampling and supplies higher frequency uniformly sampled digital data. The uniformly sampled data signal is provided to the noise shaping quantizer 2 as shown in FIG. 4. The noise shaped and quantized signal is supplied to a power stage 25 provided within the digital audio amplifier 22 which outputs an amplified signal, for instance to a loudspeaker.

Figure 12:
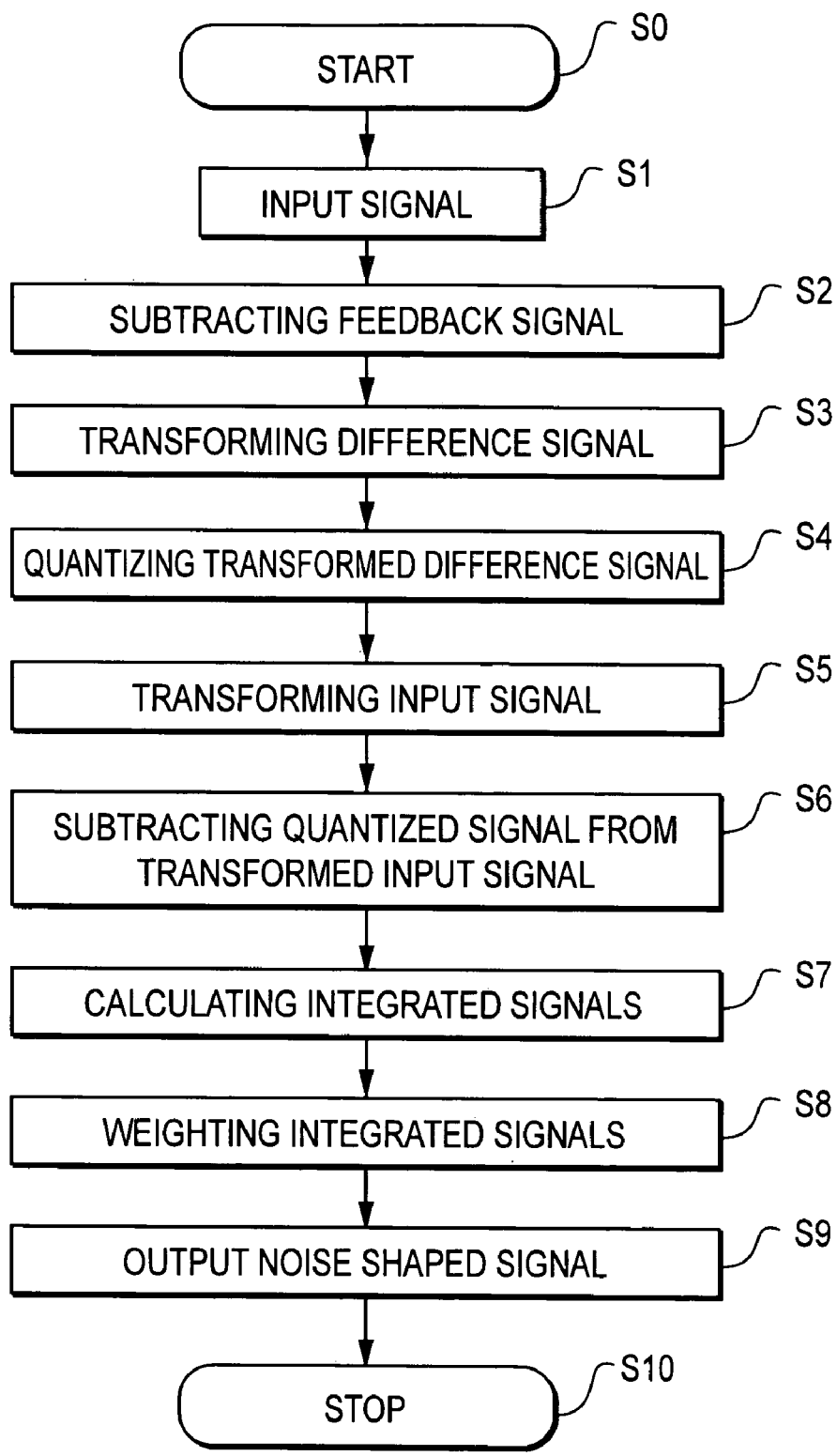
FIG. 12 shows a flowchart of a preferred embodiment of a method for noise shaping according to the present invention.

FIG. 12 shows a flowchart of a preferred embodiment of a method for noise shaping according to the present invention. The noise shaping method according to the preferred embodiment as shown in FIG. 12 comprises the following steps.

After a start-step $S_0$, an unquantized input signal, such as a two-dimensional signal of any signal form is input in step S1.

In a step S2, the feedback signal is substracted from said unquantized input signal to generate a difference signal.

In a step S3, the difference signal is transformed by a signal modulator to generate a first transformed signal which consists of signal intervals, wherein each signal interval has a corresponding signal amplitude being constant for a variable interval duration time of said signal interval.

In a step S4, the first transformed signal is quantized to generate a quantized signal $S_Q$.

In a step S5, the unquantized input signal input in step S1, is transformed to generate a second transformed signal which consists also of signal intervals, wherein each signal interval has a corresponding signal amplitude being constant for a variable interval duration time of said signal interval. This transformation is performed by a signal modulator transforming the input signal, for instance to a pulse width modulated signal.

In a step S6, the quantized signal is substracted from the second transformed signal to generate an error signal.

In a further step S7, the integrated error signals of different order are calculated from said error signal.

In a step S8, each integrated error signal is weighted with a corresponding adjustable weighting coefficient according to a desired noise transfer function NTF and the weighted integrated error signals are added to generate the feedback signal F.

In a step S9, the noise shaped quantized difference signal is output.

The process stops in step S10.

The method as shown in FIG. 12 is either implemented in hardware, as shown in FIGS. 6A, 6B or in software by use of a microprocessor or a digital signal processor.

Figure 10:
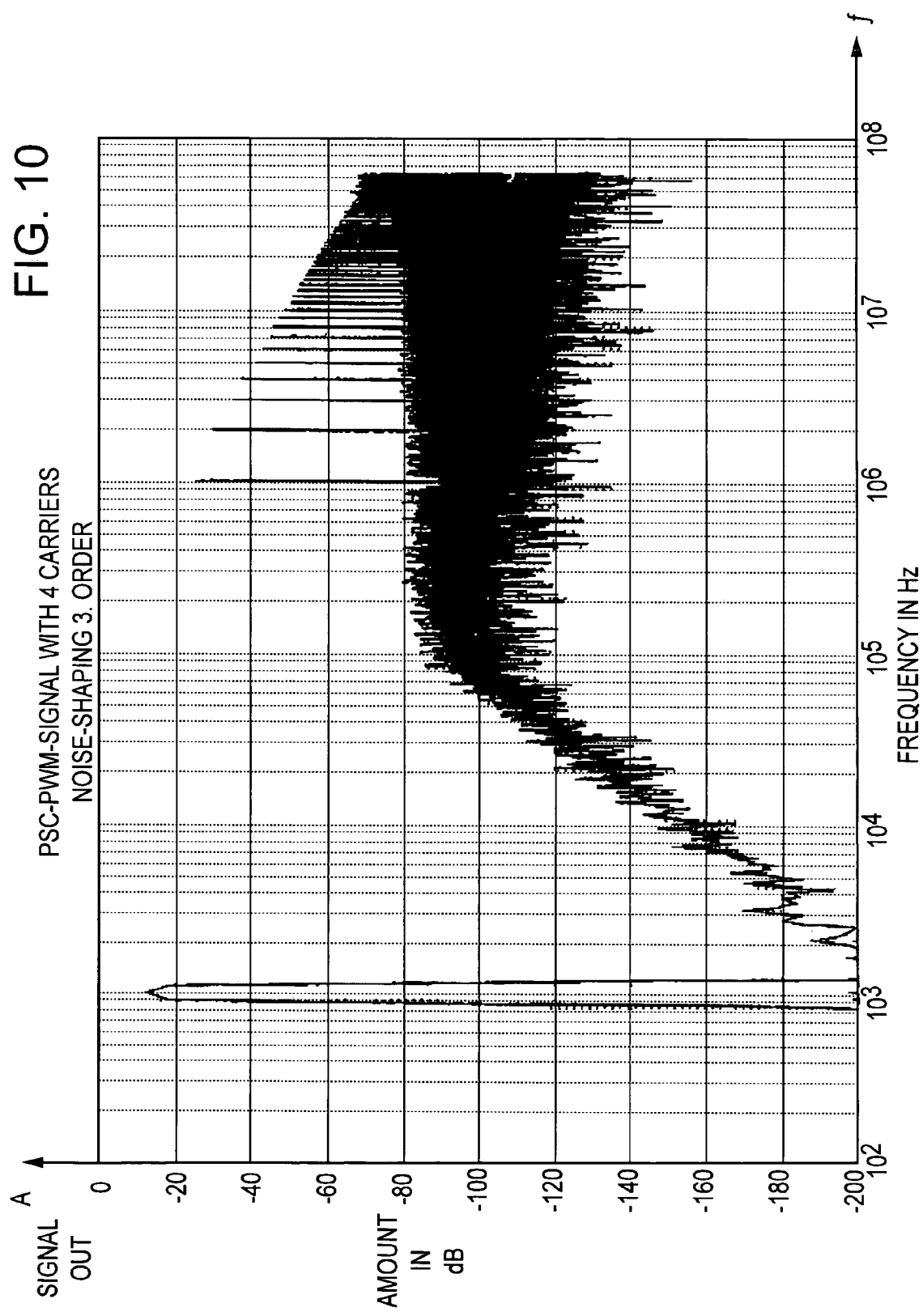
FIG. 10 shows a spectral diagram of a signal noise shaped by a noise shaper according to an embodiment of the present invention.

FIG. 10 shows a diagram of a phase shifted carrier pulse width modulated signal having four carriers which are shaped by a noise shaper 1 according to a preferred embodiment of the present invention having an order N=3 and comprising a Butterworth filter characteristic. The shaping of a phase shift carrier pulse width modulated signal PSC/PWM in a manner as shown in FIG. 10, might be performed by a noise shaper 1 as shown in FIG. 6A having three integrator stages wherein the phase shift carrier signal is applied to an input 3 of the noise shaping quantizer 2 as shown in FIG. 4 and transformed by PSC/PWM modulators 6, 16. As can be seen from FIG. 10, the signal-to-noise ratio SNR of a tone signal at a frequency of $10^3$ Hz, i.e. 1 KHz is after noise shaping very high since the noise has been shifted to a higher frequency band over a frequency of approximately $10^5$ Hz.

The signal applied to the noise shaper 1 according to the preferred embodiments of the present invention can be of any shape and, in particular, can be any two-dimensional signal carrying information in its amplitude and time.

The signal applied to the input 3 of the noise shaping quantizer 2 can also be of any form, in particular, a two-dimensional signal consisting of signal intervals, wherein each signal interval has a corresponding signal amplitude being constant for a variable interval duration time of the signal interval. These signals include, for example pulse code modulated signals PCM, pulse width modulated signals PWM, multi-level pulse width modulated signals, phase shifted carrier pulse width modulated signals, and a pulse amplitude modulated signal PAM.

The signal modulators 6, 16 are either formed by a natural sampling pulse width modulator, a uniform sampling pulse width modulator, or a click modulator.

By natural sampling, a pulse width modulated signal is calculated from an analogue signal. The analogue signal is compared with several carrier signals to generate several pulse width modulated signals which are overlapped to each other, i.e. which are added to generate an output signal.

Carrier signals are triangular signals and the crossing points of the carrier signals and the analogue input signals determine the switching time of the pulse width modulated signal. This method does not generate distortions in the base band, however, intermodulation products are generated which reach into the base band.

In uniform sampling, the amplitude values of the input signal correspond to the switching times. Although easy to implement, a non-linear relation between amplitude and time tends to create distortions of the pulse width modulated signals.

In click modulation a non-linear transformation of the analogue input signal to a pulse width signal is performed. This has the advantage, that it is not only distortion free but also that the base band is free of intermodulation products.

The noise shaping method according to the present invention allows the generation of pulse width modulated signals with any information content in the low-frequency range. This can be used for reproduction of signals which are available in the digital domain. It is possible to generate pulse width modulated signals with high power which similate in the low-frequency range to the provided reference signal. This can, in particular, be used to build power amplifiers, such as audio power amplifiers with high efficiency. Another possible application is to generate pulse width modulated signals with low power to reproduce a digital signal as accurate as possible with respect to the low-frequent information content. This is an advantage when building digital-to-analogue converters or delta-sigma-analog-digital-converters.

What is claimed is:

1. A noise shaper for shaping a power spectral density of an input signal which consists of signal intervals, wherein each signal interval has a corresponding signal amplitude which is constant for a variable interval duration time of the signal interval, said noise shaper comprising:
a calculator having at least one serially connected integrator, wherein each integrator calculates an integrated signal of different order from said input signal, and the calculator calculates an integrated error signal of M-th order according to an equation:

$$I_{DIFF}(n) = \sum_{k=1}^{M} \frac{I_{DIFF}(n-1)}{(M-k)!} + \frac{A_{11}(1-(1-T_1)^M) + A_{12}(1-T_1)^M - (A_{21}(1-(1-T_2)^M) + A_{22}(1-T_2)^M)}{M!}$$

wherein $T_1$ is a time an amplitude of an unquantized signal changes from a first amplitude $A_{11}$ to a second amplitude $A_{12}$, $T_2$ is a time an amplitude of a quantized signal changes from a first amplitude $A_{12}$ to a second amplitude $A_{22}$ within a predetermined time period T of a clock signal (CLK), wherein $0<T_1<1$, $0<T_2<1$ in an $n^{th}$ clock interval, and k is an index variable; and
a weighter which weights each integrated signal with a corresponding adjustable weighting coefficient according to a noise transfer function.

2. The noise shaper according to claim 1, wherein said calculator comprises a subtractor which subtracts a quantized signal output by a quantizer from an unquantized signal to generate an error signal which forms said input signal.

3. The noise shaper according to claim 1, wherein said noise transfer function comprises a Butterworth characteristic.

4. A noise shaper for shaping a rower spectral density of an input signal which consists of signal intervals, wherein each signal interval has a corresponding signal amplitude which is constant for a variable interval duration time of the signal interval, said noise shaper comprising:
a calculator having at least one serially connected integrator, wherein each integrator calculates an integrated signal of different order from said input signal; and
a weighter which weights each integrated signal with a corresponding adjustable weighting coefficient according to a noise transfer function, wherein said noise transfer function comprises a Tschebycheff characteristic.

5. The noise shaper according to claim 2, wherein said quantizer generates said quantized signal having a quantized amplitude and being quantized in time.

6. A noise shaping quantizer, comprising:
a signal input which receives an unquantized input signal;
a substractor which subtracts a feedback signal from said unquantized input signal to generate a difference signal;
a first modulator which transforms said difference signal to generate a first transformed signal which consists of signal intervals, each signal interval having a corresponding signal amplitude which is constant for a variable interval duration time of said signal interval;
a quantizer which quantizes said transformed first signal output by said first signal modulator to generate a quantized signal;
a second signal modulator which transforms said unquantized input signal to generate a second transformed signal which consists of signal intervals each signal interval having a corresponding signal amplitude being constant for a variable interval duration time of said signal interval;
a noise shaper having: a substracting unit which subtracts said quantized signal generated by said quantizer from said transformed second signal to generate an error signal; a calculation unit having at least one serially connected integrator, wherein each integrator calculates an integrated error signal of different order from said error signal; and a weighting unit which weights each integrated error signal with a corresponding adjustable weighting coefficient according to a noise transfer function and sums the weighted integrated error signals to generate said feedback signal; and a signal output which outputs the noise shaped quantized difference signal.

7. The noise shaping quantizer according to claim 6, wherein said quantized signal is output to a power stage of an amplifier.

8. The noise shaping quantizer according to claim 6, wherein said unquantized input signal is a pulse code modulated signal (PCM).

9. The noise shaping quantizer according to claim 6, wherein said unquantized input signal is a pulse amplitude modulated signal (PAM).

10. The noise shaping quantizer according to claim 6, wherein the first and second signal modulators transforms a signal applied to said signal modulators respectively into a pulse width modulated signal having at least two amplitude levels.

11. The noise shaping quantizer according to claim 7, wherein the quantized signal is a pulse width modulated signal which is output to a power stage of a digital audio amplifier.

12. The noise shaping quantizer according to claim 6, wherein said signal modulators are natural sampling pulse width modulators.

13. The noise shaping quantizer according to claim 6, wherein said signal modulators are uniform sampling pulse width modulators.

14. The noise shaping quantizer according to claim 6, wherein said signal modulators are click modulators.

15. A noise shaping quantizer, comprising:
a signal input which receives an unquantized input signal which consists of signal intervals, each signal interval having a corresponding signal amplitude which is constant for a variable interval duration time of said signal interval;
a first signal modulator which transforms the input signal into a first pulse width modulated signal having at least two amplitude levels;
a substractor which subtracts a feedback signal from said unquantized input signal to generate a difference signal;
a second signal modulator which transforms the difference signal into a second pulse width modulated signal having at least two amplitude levels;
a quantizer which quantizes the second pulse width modulated signal output by said second signal modulator to generate a quantized pulse width modulated signal;
a noise shaper having: a substracting unit which subtracts said quantized pulse width modulated signal generated by said quantizer from said first pulse width modulated signal output by said first signal modulator to generate an error signal; a calculation unit having at least one serially connected integrator, wherein each integrator calculates an integrated error signal of different order from said error signal; and a weighting unit which weights each integrated error signal with a corresponding adjustable weighting coefficient according to a noise transfer function and sums the weighted integrated error signals to generate said feedback signal; and a signal output which outputs the noise shaped quantized pulse width modulated signal generated by said quantizer.

16. The noise shaping quantizer according to claim 15, wherein the noise shaped quantized pulse width signal is output to a power stage of an audio amplifier.

17. A method for noise shaping a power spectral density of a signal which consists of signal intervals, wherein each signal interval has a corresponding signal amplitude which is constant for a variable interval duration time of said signal interval, wherein said method comprises:
calculating integrated signals of different order from said input signal, and calculating an integrated error signal of M-th order according to an equation:

$$I_{DIFF}(n) = \sum_{k=1}^{M} \frac{I_{DIFF}(n-1)}{(M-k)!} + \frac{A_{11}(1-(1-T_1)^M) + A_{12}(1-T_1)^M - (A_{21}(1-(1-T_2)^M) + A_{22}(1-T_2)^M)}{M!}$$

wherein $T_1$ is a time an amplitude of an unquantized signal changes from a first amplitude $A_{11}$ to a second amplitude $A_{12}$, $T_2$ is a time an amplitude of a quantized signal changes from a first amplitude $A_{12}$ to a second amplitude $A_{22}$ within a predetermined time period T of a clock signal (CLK) wherein $0<T_1<1$, $0<T_2<1$ in an $n^{th}$ clock interval, and k is an index variable; and weighting each integrated signal with a corresponding adjustable weighting coefficient according to a noise transfer function and summing the weighted integrated signals to generate an output signal.

18. A method for generating a noise shaped quantized signal, comprising:
inputting an unquantized input signal;
substracting a feedback signal from said unquantized input signal to generate a difference signal;
transforming said difference signal to generate a first transformed signal which consists of signal intervals, each signal interval having a corresponding signal amplitude which is constant for a variable interval duration time of said signal interval;
quantizing said first transformed signal to generate a quantized signal;
transforming said unquantized input signal to generate a second transformed signal which consists of signal intervals, each signal interval having a corresponding signal amplitude which is constant for a variable interval duration time of said signal interval;
substracting said quantized signal from said second transformed signal to generate an error signal;
calculating integrated error signals of different order from said error signal;
weighting each integrated error signal with a corresponding adjustable weighting coefficient according to a noise transfer function and summing the weighted integrated error signals to generate said feedback signal; and
outputting the noise shaped quantized difference signal.

* * * * *

UNITED STATES PATENT AND TRADEMARK OFFICE
CERTIFICATE OF CORRECTION

| | |
|---|---|
| PATENT NO. | : 7,307,557 B2 |
| APPLICATION NO. | : 11/258858 |
| DATED | : December 11, 2007 |
| INVENTOR(S) | : Carsten Wegner and Thomas Schulze |

Page 1 of 1

It is certified that error appears in the above-identified patent and that said Letters Patent is hereby corrected as shown below:

At column 10, line 26 (claim 4) of the printed patent, "rower" should read --power--.

At column 12, line 22 (claim 17) of the printed patent, "unguantized" should read --unquantized--.

Signed and Sealed this

Eighth Day of July, 2008

JON W. DUDAS
*Director of the United States Patent and Trademark Office*